United States Patent
Kim et al.

(10) Patent No.: US 7,187,007 B2
(45) Date of Patent: Mar. 6, 2007

(54) NITRIDE SEMICONDUCTOR DEVICE AND METHOD OF MANUFACTURING THE SAME

(75) Inventors: Je Won Kim, Kyungki-do (KR); Sun Woon Kim, Seoul (KR); Dong Joon Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/052,103

(22) Filed: Feb. 8, 2005

(65) Prior Publication Data

US 2006/0006407 A1   Jan. 12, 2006

(30) Foreign Application Priority Data

Jul. 9, 2004 (KR) .................. 10-2004-0053392

(51) Int. Cl.
*H01L 33/00* (2006.01)
(52) U.S. Cl. .................. 257/79; 257/94; 257/98; 257/E33.026; 257/E33.027; 257/E33.028
(58) Field of Classification Search .................. 257/87, 257/79
See application file for complete search history.

(56) References Cited

U.S. PATENT DOCUMENTS

| | | | |
|---|---|---|---|
| 5,506,423 A * | 4/1996 | Saeki .................. | 257/97 |
| 5,732,098 A * | 3/1998 | Nisitani et al. .......... | 372/45.01 |
| 6,185,238 B1* | 2/2001 | Onomura et al. ........ | 372/46.01 |
| 6,420,732 B1* | 7/2002 | Kung et al. ................. | 257/79 |
| 6,465,808 B2* | 10/2002 | Lin ............................. | 257/81 |
| 6,858,873 B2* | 2/2005 | Lee ............................. | 257/81 |
| 6,958,494 B2* | 10/2005 | Lin et al. .................... | 257/86 |
| 6,958,496 B2* | 10/2005 | Chien et al. ................ | 257/91 |
| 6,977,953 B2* | 12/2005 | Hata et al. ................ | 372/46.01 |
| 2005/0087884 A1* | 4/2005 | Stokes et al. ............... | 257/778 |
| 2005/0236636 A1* | 10/2005 | Hon et al. .................... | 257/99 |

* cited by examiner

*Primary Examiner*—Leonardo Andujaf
*Assistant Examiner*—Eduardo A. Rodela
(74) *Attorney, Agent, or Firm*—Lowe Hauptman & Berner, LLP.

(57) ABSTRACT

The present invention provides a nitride semiconductor device. The nitride semiconductor device comprises an n-type nitride semiconductor layer formed on a nitride crystal growth substrate. An active layer is formed on the n-type nitride semiconductor layer. A first p-type nitride semiconductor layer is formed on the active layer. A microstructured current diffusion pattern is formed on the first p-type nitride semiconductor layer. The current diffusion pattern is made of an insulation material. A second p-type nitride semiconductor layer is formed on the first p-type nitride semiconductor layer having the current diffusion pattern formed thereon.

8 Claims, 3 Drawing Sheets

NITRIDE SEMICONDUCTOR DEVICE AND METHOD OF MANUFACTURING THE SAME

RELATED APPLICATION

The present application is based on, and claims priority from, Korean Application No. 2004-53392, filed on Jul. 9, 2004, the disclosure of which is incorporated by reference herein in its entirety.

BACKGROUND OF THE INVENTION

1. Field of the Invention

The present invention relates to a nitride semiconductor device, and more particularly to a nitride semiconductor device having improved current diffusion and increased surface roughness, whereby electric and optical characteristics are improved. Also, the present invention relates to a method of manufacturing the same.

2. Description of the Related Art

Generally, a nitride semiconductor is widely used as a material for manufacturing visible-light, ultraviolet-light, and cyan optical devices, such as a light emitting diode (LED) or a laser diode (LD), since the nitride semiconductor has the characteristics of emitting light having a wide range from visible light to ultraviolet light. The nitride semiconductor is a semiconductor single crystal satisfying the following formula: $Al_xIn_yGa_{(1-x-y)}N$ (where, $0 \leq x \leq 1$, $0 \leq y \leq 1$, and $0 \leq x+y \leq 1$). The nitride semiconductor is grown on a substrate, such as sapphire or SiC, by means of a crystal growth process, such as Metal Organic Chemical Vapor Deposition (MOCVD).

Principally, a nitride-based semiconductor device comprises an n-type nitride semiconductor layer, an undoped active layer, and a p-type nitride semiconductor layer. A conventional nitride semiconductor device 10 is shown in FIG. 1.

Referring to FIG. 1, the conventional nitride semiconductor device 10 comprises a sapphire substrate 11 having a buffer layer 12, such as a GaN or AlN low-temperature core growth layer, formed thereon. On the buffer layer is formed an n-type nitride semiconductor layer 13. On the n-type nitride semiconductor layer 13 is formed an undoped active layer 14. On the undoped active layer 14 is formed a p-type nitride semiconductor layer 15. To the n-type nitride semiconductor layer 13 and the p-type nitride semiconductor layer 15 are connected n-side and p-side electrodes 18 and 19, respectively. The active layer 14 has a multi-quantum well structure (MQW) in which quantum barrier layers made of GaN and quantum well layers made of InGaN are alternately stacked several times.

When predetermined current is applied between the two electrodes 18 and 19, electrons provided from the n-type nitride semiconductor layer 13 are recombined with holes provided from the p-type nitride semiconductor layer 15 in the active layer 14 having the multi-quantum well structure. As a result, light having a desired wavelength, such as a green wavelength or a blue wavelength, is emitted.

In order to improve light efficiency of the nitride semiconductor device, brisk studies into improving inner quantum efficiency and outer quantum efficiency (i.e., light extraction efficiency) have been made. To improve the inner quantum efficiency, it is necessary to increase light efficiency generated from the active layer. In this case, the structure of the active layer 14 and the crystal qualities of the epitaxial layers 13, 14, and 15 are focused.

The inner quantum efficiency is seriously limited due to ununiform current diffusion. As shown in FIG. 1, electric current is concentrated to a part A of the active layer 14 with the result that the other parts of the active layer 14 have a relatively low current density. Consequently, the entirety of the active layer does not serve as a light-emitting region, which decreases the inner quantum efficiency. Up to now, improvement of electrode arrangement and a p-side electrode structure has focused on ensuring uniform current diffusion.

Also, a refractive index and surface flatness of a semiconductor material may be controlled to improve the outer quantum efficiency (i.e., light extraction efficiency). However, the refractive index of the nitride semiconductor has a limited changeable range. As a result, the outer quantum efficiency is improved just a little. To control the surface flatness, it is necessary to increase surface roughness such that a total reflection angle is decreased in the device, and thus the amount of light lost in the device is decreased. However, it is necessary to perform pattern formation through the use of Metal Organic Chemical Vapor Deposition (MOCVD) or other CVD processes in order to increase the surface roughness, which is very troublesome.

As described above, various efforts to improve the light efficiency of the nitride semiconductor device have been made, and it is still necessary to improve the electric and optical characteristics, and thus the light efficiency, by means of more effective methods.

SUMMARY OF THE INVENTION

Therefore, the present invention has been made in view of the above problems, and it is an object of the present invention to provide a nitride semiconductor device having a micro-structured current diffusion pattern formed in a clad layer, thereby accomplishing uniform current diffusion.

It is another object of the present invention to provide a method of manufacturing a nitride semiconductor device that is capable of forming a micro-structured insulation pattern in a clad layer to improve current diffusion efficiency and repetitively forming the insulation pattern on the surface of an upper clad layer to increase surface roughness, thereby improving light extraction efficiency.

In accordance with one aspect of the present invention, the above and other objects can be accomplished by the provision of a nitride semiconductor device comprising: an n-type nitride semiconductor layer formed on a nitride crystal growth substrate; an active layer formed on the n-type nitride semiconductor layer; a first p-type nitride semiconductor layer formed on the active layer; a micro-structured current diffusion pattern formed on the first p-type nitride semiconductor layer, the current diffusion pattern being made of an insulation material; and a second p-type nitride semiconductor layer formed on the first p-type nitride semiconductor layer having the current diffusion pattern formed thereon.

Preferably, the current diffusion pattern is composed of a silicon nitride ($SiN_x$) arranged in a nano-sized dot structure. The silicon nitride pattern is formed on the surface of the second p-type nitride semiconductor layer, and the surface of the second p-type nitride semiconductor layer is etched using the silicon nitride pattern as a mask such that a light emitting surface has predetermined surface roughness, whereby light extraction efficiency is improved.

Preferably, the thickness of the current diffusion pattern is not more than approximately 10 Å.

In a preferred embodiment of the present invention, the n-type nitride semiconductor layer comprises: a first n-type nitride semiconductor layer formed on the upper surface of the substrate; a silicon nitride pattern formed on the first n-type nitride semiconductor layer, the silicon nitride pattern being arranged in a nano-sized dot structure; and a second n-type nitride semiconductor layer formed on the first n-type nitride semiconductor layer having the silicon nitride pattern formed thereon.

In accordance with another aspect of the present invention, there is provided a method of manufacturing a nitride semiconductor device by means of vapor deposition, the method comprising the steps of: forming an n-type nitride semiconductor layer on a nitride crystal growth substrate; forming an active layer on the n-type nitride semiconductor layer; forming a first p-type nitride semiconductor layer on the active layer; forming a micro-structured current diffusion pattern on the first p-type nitride semiconductor layer, the current diffusion pattern being made of an insulation material; and forming a second p-type nitride semiconductor layer on the first p-type nitride semiconductor layer having the current diffusion pattern formed thereon.

Preferably, the current diffusion pattern forming step comprises the sub-step of: forming a silicon nitride ($SiN_x$) arranged in a nano-sized dot structure. In the current diffusion pattern forming step, silane ($SiH_4$) or tetraethylsilane and ammonia gas are supplied, following the nitride semiconductor growth process, such that a silicon nitride pattern having a nano-sized dot structure is formed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings.

Figure 1:
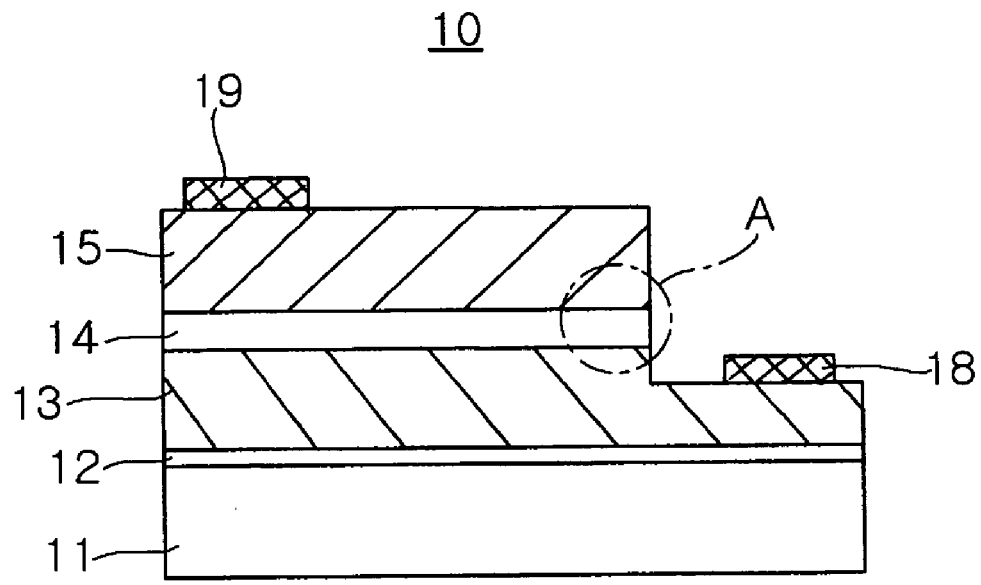
FIG. 1 is a side view, in section, showing a conventional nitride semiconductor device.
Figure 2:
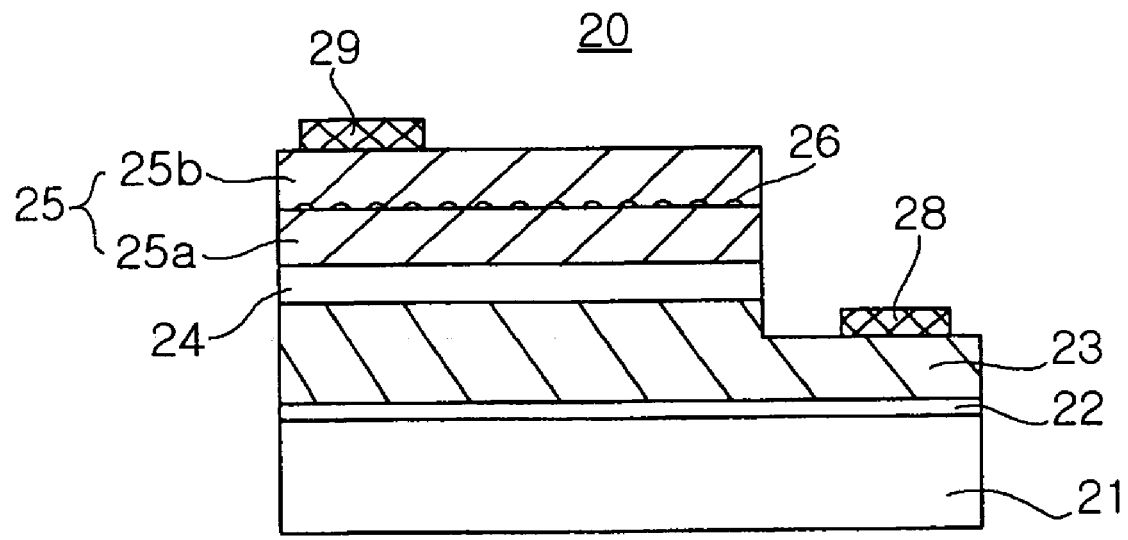
FIG. 2 is a side view, in section, showing a nitride semiconductor device according to a preferred embodiment of the present invention.

FIG. 2 is a side view, in section, showing a nitride semiconductor device according to a preferred embodiment of the present invention.

Referring to FIG. 2, the nitride semiconductor device 20 comprises a sapphire substrate 21, an n-type nitride semiconductor layer 23 formed on the sapphire substrate 21, an undoped active layer 24 formed on the n-type nitride semiconductor layer 23, and a p-type nitride semiconductor layer 25 formed on the undoped active layer 24. In order to grow a quality epitaxial layer, a buffer layer 22, such as a GaN or AlN low-temperature core growth layer may be formed on the sapphire substrate 21 before the n-type nitride semiconductor layer 23 is formed.

The nitride semiconductor device 20 further comprises n-side and p-side electrodes 28 and 29 connected to the n-type nitride semiconductor layer 23 and the p-type nitride semiconductor layer 25, respectively. The active layer 24 has a multi-quantum well structure in which quantum barrier layers made of GaN and quantum well layers made of InGaN are alternately stacked several times.

In this embodiment of the present invention, the p-type nitride semiconductor layer 25 comprises a first p-type nitride semiconductor layer 25a and a second p-type nitride semiconductor layer 25b. On the first p-type nitride semiconductor layer 25a is formed a current diffusion pattern 26, which is made of an insulation material. The current diffusion pattern 26, formed in a microstructure, is disposed on the upper surface of the first p-type nitride semiconductor layer 25a for uniformly diffusing electric current over the entire area. Especially, holes provided to the active layer 24 through the first and second p-type nitride semiconductor layers 25a and 25b have movability lower than that of electrons. Consequently, light efficiency is considerably improved though the current diffusion effect according to the present invention.

The thickness of each of the first and second p-type nitride semiconductor layers 25a and 25b is approximately 50 Å to 2000 Å. Preferably, the thickness of the current diffusion pattern 26 is not more than approximately 10 Å. This is because forward voltage is increased due to the insulation property of a material constituting the current diffusion pattern 26 when the thickness of the current diffusion pattern 26 exceeds 10 Å.

Preferably, the insulating current diffusion pattern 26 may be a silicon nitride ($SiN_x$) pattern arranged in a nano-sized dot structure. This current diffusion pattern 26 may be easily formed through the supply of an Si material gas, such as silane or tetraethylsilane, together with a nitrogen material gas, such as ammonia gas ($NH_3$) in a vapor deposition process, such as Metal Organic Chemical Vapor Deposition (MOCVD). The current diffusion pattern 26 made of the silicon nitride that can be preferably adopted in the present invention serves as an anti-surfactant at the nitride semiconductor layer, such as GaN, without carrying out an additional patterning process. As a result, the current diffusion pattern 26 can be spontaneously formed in a nano-sized pattern. Also, the current diffusion pattern 26 can be successively formed in the Metal Organic Chemical Vapor Deposition (MOCVD), as described above. The thickness of the current diffusion pattern 26 made of the silicon nitride is less than 10 Å. Preferably, the thickness of the current diffusion pattern is 1 to 2 atomic layers (ML).

Furthermore, the present invention may provide various modifications through application of the current diffusion pattern forming process.

First of all, a predetermined mask pattern is formed on the upper surface of the second p-type nitride semiconductor layer to increase the surface roughness of the upper surface of the second p-type nitride semiconductor layer, whereby light extraction efficiency is improved. According to the present invention, the mask pattern is formed by means of the same process as the above-described current diffusion pattern forming process. Consequently, the mask pattern that increases the surface roughness is easily formed through a repetitive simple process following the Metal Organic Chemical Vapor Deposition (MOCVD).

An additional pattern having a structure similar to the current diffusion pattern according to the present invention may be disposed in the n-type nitride semiconductor layer as an intermediate layer. Specifically, the additional pattern is formed in the course of growing the n-type nitride semiconductor layer to improve current diffusion and prevent increase of dislocation density. Consequently, the additional pattern may be used as means for growing a high-quality crystal.

Figure 3:
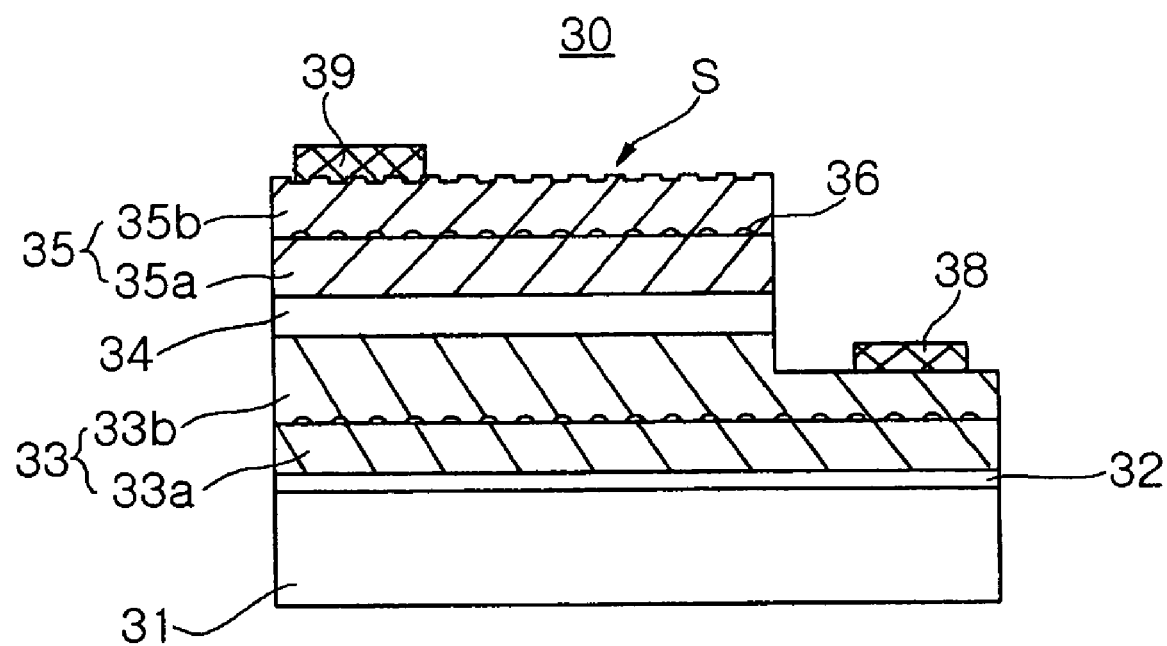
FIG. 3 is a side view, in section, showing a nitride semiconductor device according to another preferred embodiment of the present invention.

As described above, the present invention incorporates other characteristic components, by which various embodiments may be realized. FIG. 3 shows another preferred embodiment of the present invention wherein surface roughness of the upper surface of a second p-type nitride semiconductor layer is increased through the use of a process similar to the current diffusion pattern forming process to improve the characteristics of an n-type nitride semiconductor layer.

Referring to FIG. 3, the nitride semiconductor device 30 comprises a sapphire substrate 31 having a buffer layer 32, such as a GaN or AlN low-temperature core growth layer, formed thereon, an n-type nitride semiconductor layer 33 formed on the buffer layer 32, an undoped active layer 34 formed on the n-type nitride semiconductor layer 33, and a p-type nitride semiconductor layer 35 formed on the undoped active layer 34, which is similar to the construction of the present invention shown in FIG. 2. The nitride semiconductor device 30 further comprises n-side and p-side electrodes 38 and 39 connected to the n-type nitride semiconductor layer 33 and the p-type nitride semiconductor layer 35, respectively. The active layer 34, composed of GaN/InGaN, may have a multi-quantum well structure.

In this embodiment of the present invention, the p-type nitride semiconductor layer 35 comprises a first p-type nitride semiconductor layer 35a and a second p-type nitride semiconductor layer 35b, which is similar to the construction of the present invention shown in FIG. 2. On the first p-type nitride semiconductor layer 35a is formed a current diffusion pattern 36, which is made of an insulation material. The current diffusion pattern 36, formed in a microstructure, is disposed on the upper surface of the first p-type nitride semiconductor layer 35a for uniformly diffusing electric current over the entire area.

Also, the second p-type nitride semiconductor layer 35b has an upper surface S with predetermined surface roughness. The total reflection angle of light emitted from the active layer 34 is decreased due to the irregular uneven shapes resulting from the surface roughness. As a result, the upper surface S of the second p-type nitride semiconductor layer 35b, as the main light emitting surface, decreases the total inner reflection, whereby light extraction efficiency is improved. Especially in this embodiment of the present invention, in order to form the upper surface S that improves the light extraction efficiency, a pattern structure, such as the current diffusion pattern 36, is formed on the upper surface of the second p-type nitride semiconductor layer 35b. When the pattern structure is used as an etching mask, the surface roughness can be simply and easily increased as compared to the conventional surface roughness increasing process. More specifically, a silicon nitride pattern structure having a micro-pattern (not shown) is formed through the supply of ammonia gas together with silane or tetraethylsilane after forming the second p-type nitride semiconductor layer 35b, as in the process of forming the current diffusion pattern 36. Consequently, the etching mask may be easily formed in a Metal Organic Chemical Vapor Deposition (MOCVD) chamber following the epitaxial layer growth process. It should be noted that the nitride pattern structure used as the etching mask may be removed from finished products.

An additional pattern 37 having a structure similar to the current diffusion pattern 36 according to the present invention may be disposed in the n-type nitride semiconductor layer 33 as an intermediate layer. The additional pattern 37, i.e., an inner micro pattern disposed in the n-type nitride semiconductor layer 33 serves to improve current diffusion and prevent increase of dislocation density. Specifically, the n-type nitride semiconductor layer 33 comprises a first n-type nitride semiconductor layer 33a and a second n-type nitride semiconductor layer 33b, and the inner micro pattern 37, which is made of an insulation material, is formed on the first n-type nitride semiconductor layer 33a, as shown in FIG. 3. The inner micro pattern 37 disposed in the n-type nitride semiconductor layer 22 selectively improves current diffusion or prevents increase of dislocation density depending upon the position where the inner micro pattern 37 is formed. For example, the inner micro pattern 37 may be used as means for preventing increase of dislocation density rather than improving current diffusion, to obtain quality epitaxial layers when the inner micro pattern 37 is disposed adjacent to the substrate 31 at the position lower than the height of the n-side electrode 38 in the case of an embodiment where a mesh structure is adopted to form electrodes as in this embodiment In another more preferred embodiment of the present invention, the etching mask forming process, which is carried out to form the inner micro pattern 37 and the current diffusion pattern and increase the surface roughness, may be adopted in the Metal Organic Chemical Vapor Deposition (MOCVD) such that the etching mask forming process can be carried out successively through the Metal Organic Chemical Vapor Deposition (MOCVD) for growing the nitride semiconductor layer. More specifically, a silicon nitride ($SiN_x$) pattern arranged in a nano-sized dot structure may be easily formed through the supply of an Si material gas, such as silane or tetraethylsilane, together with a nitrogen material gas, such as ammonia gas ($NH_3$) at the necessary growth position during the Metal Organic Chemical Vapor Deposition (MOCVD) for epitaxial growth of the nitride.

FIGS. 4A to 4E are sectional views illustrating a method of manufacturing a nitride semiconductor device according to yet another preferred embodiment of the present invention. In this embodiment of the present invention, a pattern structure similar to a current diffusion pattern is used as an etching mask.

Figure 4:
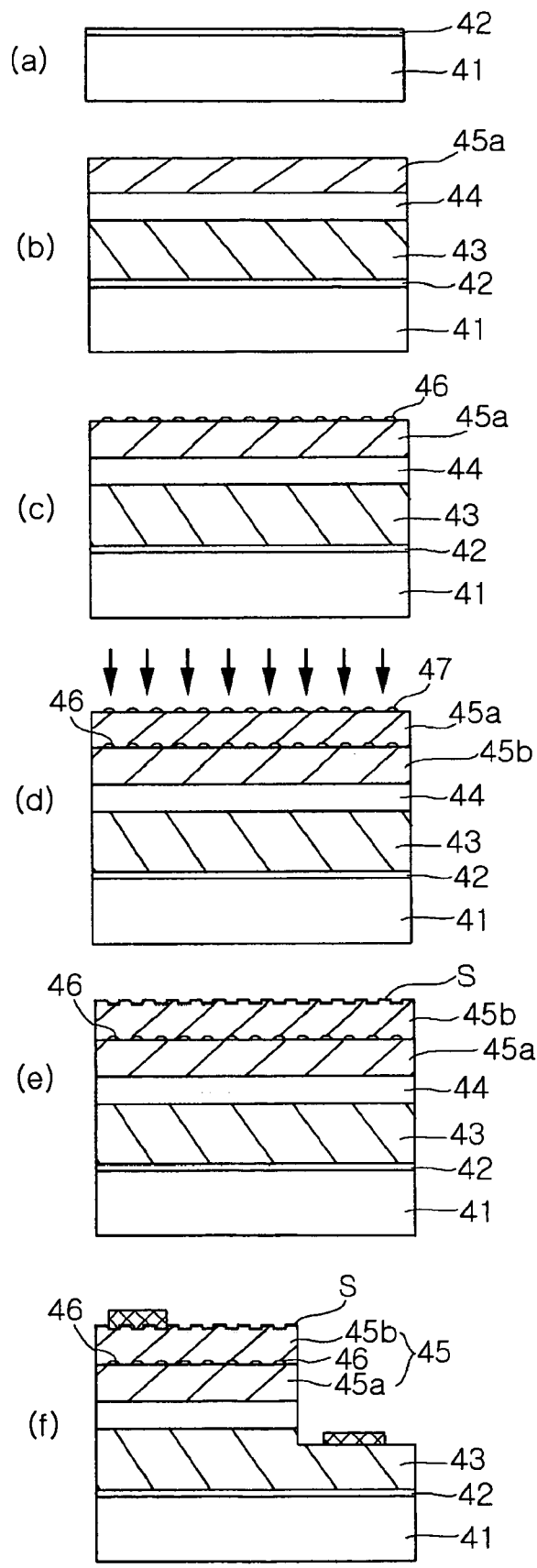
FIGS. 4A to 4F are sectional views illustrating a method of manufacturing a nitride semiconductor device according to yet another preferred embodiment of the present invention.

As shown in FIG. 4A, a buffer layer 42 is formed on a nitride crystal growth substrate 41. A sapphire substrate is used as the nitride crystal growth substrate 41. Alternatively, a GaN substrate, which is the same kind of substrate as the sapphire substrate, or different kind of substrate, such as a SiC substrate or a Si substrate, may be used. Also, the buffer layer 42 may be a low-temperate AlN or GaN layer.

Subsequently, an n-type nitride semiconductor layer 43 is formed on the buffer layer 42, an active layer 44 is formed on the n-type nitride semiconductor layer 43, and a first p-type nitride semiconductor layer 45a is formed on the active layer 44, as shown in FIG. 4B. The nitride semiconductor layers 43 and 45a may be a GaN or AlGaN layer, and the active layer may be a GaN/InGaN layer having a multi-quantum well structure. The layers are grown in a Metal Organic Chemical Vapor Deposition (MOCVD) chamber at approximately 1000 to 1200° C. through the supply of ammonia gas ($NH_3$) together with an appropriate combination of trimethylgallium (TMG), trimethylaluminum (TMA) and trimethylindium (TMI).

Subsequently, a micro-structured current diffusion pattern 46, which is made of an insulation material, is formed on the first p-type nitride semiconductor layer 45a, as shown in FIG. 4C. Preferably, the supply of the trimethylgallium (TMG) and/or the trimethylaluminum (TMA), which has been supplied to form the p-type nitride semiconductor layer, is stopped, and an Si material gas, such as silane or tetraethylsilane, is successively supplied in an atmosphere of the ammonia gas in the Metal Organic Chemical Vapor Deposition (MOCVD) chamber, whereby the current diffusion pattern 46 may be formed of a silicon nitride ($SiN_x$). The current diffusion pattern 46 made of the silicon nitride serves as an anti-surfactant. As a result, the current diffusion pattern 46 can be spontaneously formed in a nano-sized pattern. The current diffusion pattern 46 serves to uniformly diffuse current over the entire area.

As shown in FIG. 4D, a second p-type nitride semiconductor layer 46b is formed on the first p-type nitride semiconductor layer 45a having the current diffusion pattern 46 formed thereon. Subsequently, a mask pattern 47, which is made of an insulation material, is formed, and is then etched such that the surface of the mask pattern 47 has a predetermined surface roughness. According to the present invention, the mask pattern 47 may be formed by means of a process similar to that of FIG. 4C. Specifically, the supply of the trimethylgallium (TMG) and/or the trimethylaluminum (TMA), which has been supplied to form the p-type nitride semiconductor layer, is stopped, and an Si material gas, such as silane or tetraethylsilane, is successively supplied in an atmosphere of the ammonia gas in the Metal Organic Chemical Vapor Deposition (MOCVD) chamber, whereby the mask pattern 47 may be formed of a desired silicon nitride.

Subsequently, the mask pattern 47 is removed such that the upper surface of the second p-type nitride semiconductor layer 45b has the predetermined surface roughness as shown in FIG. 4E. The upper surface S of the second p-type nitride semiconductor layer 45b is made rough by means of the process of FIG. 4D. Consequently, the total reflection angle of light emitted from the device is decreased. When the total reflection angle is decreased, the amount of light lost in the course of the total inner reflection is decreased, and thus final light extraction efficiency is considerably improved. As described above, the process of processing the upper surface S of the second p-type nitride semiconductor layer 45b is easily carried out through the use of the mask pattern 47 that can be successively formed in the Metal Organic Chemical Vapor Deposition (MOCVD).

Finally, mesa etching is carried out to partially expose the upper surface of the n-type nitride semiconductor layer 43, and an n-side electrode 48 and a p-side electrode 49 are formed on the exposed upper surface of the n-type nitride semiconductor layer 43 and on the upper surface of the second p-type nitride semiconductor layer 45b, respectively, as shown in FIG. 4F. Those skilled in the art will appreciate that a well-known transparent electrode layer or an ITO layer may be further adopted to reduce contact resistance between the second p-type nitride semiconductor layer 45b and the p-side electrode 49, which is not shown in FIG. 4F.

EXAMPLE

Two nitride semiconductor devices were manufactured under the same conditions to confirm the effect of the current diffusion pattern according to the present invention.

A sapphire substrate was placed in a Metal Organic Chemical Vapor Deposition (MOCVD) chamber, and trimethylaluminum and ammonia gas were supplied to form a buffer layer having a thickness of approximately 20 nm at a temperature of 550° C. After that, an epitaxial layer for the nitride semiconductor layer was grown. Specifically, trimethyl gas and ammonia gas were supplied to form an n-type GaN layer having a thickness of 1.5 μm at a temperature of approximately 1100° C. At this time, Si was used as an n-type impurity. Subsequently, the injection amount of trimethylindium was adjusted to form a multi-quantum well structure consisting of InGaN/GaN.

Next, a nitride semiconductor device identical to the conventional nitride semiconductor device (hereinafter, referred to as "comparative example") and a nitride semiconductor device according to the present invention having a structure similar to that of FIG. 2 (hereinafter, referred to as "inventive example") were manufactured such that the nitride semiconductor devices have different p-type GaN layer structures.

The comparative example was manufactured as follows: Trimethyl gas and ammonia gas were supplied, and Mg was used as a p-type impurity to form a p-type GaN layer having a thickness of 0.4 μm.

The inventive example was manufactured as follows: A first p-type GaN layer having a thickness of 0.2 μm was grown in the same manner as the conventional p-type GaN layer. After the first p-type GaN layer was grown, ammonia gas and silane were supplied to form a current diffusion pattern, which composed of SiNx, such that the current diffusion pattern has a thickness of approximately 5 Å. Subsequently, a second p-type GaN layer having a thickness of 0.2 μm was grown.

The nitride epitaxial layers manufactured as described above were subjected to mesa etching under the same conditions, and then p-side and n-side electrodes were formed to manufacture two nitride semiconductor devices (a comparative example and an inventive example). Subsequently, forward voltages at approximately 5 mA were measured for the comparative example and the inventive example.

The forward voltage was approximately 3.8 V for the comparative example, and the forward voltage was approximately 3.4 V for the inventive example. It can be seen from the results of measurement that the forward voltage was decreased by approximately 0.4 V by means of the current diffusion pattern according to the present invention, and correspondingly the current diffusion effect was improved.

As apparent from the above description, the present invention provides a nitride semiconductor device having a micro-structured current diffusion pattern disposed in a p-type nitride semiconductor layer. Consequently, the present invention has the effect of improving current diffusion efficiency. Furthermore, a mask is formed on the upper surface of the p-type nitride semiconductor layer using a process similar to the current diffusion pattern forming process. Consequently, a surface processing process is more easily carried out, and thus light extraction efficiency is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor device comprising:
   an n-type nitride semiconductor layer formed on a nitride crystal growth substrate;
   an active layer formed on the n-type nitride semiconductor layer;
   a first p-type nitride semiconductor layer formed on the active layer;
   a micro-structured current diffusion pattern formed on the first p-type nitride semiconductor layer, the current diffusion pattern being made of an insulation material; and
   a second p-type nitride semiconductor layer formed on the first p-type nitride semiconductor layer having the current diffusion pattern formed thereon;
   wherein, the thickness of the current diffusion pattern is not more than approximately 10 Å.

2. The device as set forth in claim 1, wherein the current diffusion pattern is composed of a silicon nitride ($SiN_x$) arranged in a nano-sized dot structure.

3. The device as set forth in claim 2, wherein the second p-type nitride semiconductor layer has an upper surface etched using a pattern similar to the current diffusion pattern as a mask such that the upper surface of the second p-type nitride semiconductor layer has predetermined surface roughness.

4. The device as set forth in claim 1, wherein the thickness of each of the first and second p-type nitride semiconductor layers is approximately 50 Å to 2000 Å.

5. A nitride semiconductor device comprising:
   an n-type nitride semiconductor layer formed on a nitride crystal growth substrate;
   an active layer formed on the n-type nitride semiconductor layer;
   a first p-type nitride semiconductor layer formed on the active layer;
   a micro-structured current diffusion pattern formed on the first p-type nitride semiconductor layer, the current diffusion pattern being made of an insulation material; and
   a second p-type nitride semiconductor layer formed on the first p-type nitride semiconductor layer having the current diffusion pattern formed thereon;
   wherein, the n-type nitride semiconductor layer comprises:
   a first n-type nitride semiconductor layer formed on the upper surface of the substrate;
   a silicon nitride pattern formed on the first n-type nitride semiconductor layer, the silicon nitride pattern being arranged in a nano-sized dot structure; and
   a second n-type nitride semiconductor layer formed on the first n-type nitride semiconductor layer having the silicon nitride pattern formed thereon.

6. The device as set forth in claim 5, wherein the current diffusion pattern is composed of a silicon nitride ($SiN_x$) arranged in a nano-sized dot structure.

7. The device as set forth in claim 6, wherein the second p-type nitride semiconductor comprises an upper surface etched using a pattern similar to the current diffusion pattern such that the upper surface of the second p-type nitride semiconductor layer has a predetermined surface roughness.

8. The device as set forth in claim 5, wherein the thickness of each of the first and second p-type nitride semiconductor layers is approximately 50 Å to 2000 Å.

* * * * *